US012631679B2

(12) United States Patent
Sung et al.

(10) Patent No.: US 12,631,679 B2
(45) Date of Patent: May 19, 2026

(54) ELECTRONIC DEVICE HAVING CONTACT PADS FOR TESTING AND MOUNTING ELECTRONIC COMPONENT AND TEST METHOD FOR ELECTRONIC DEVICE

(71) Applicant: CARUX TECHNOLOGY PTE. LTD., Singapore (SG)

(72) Inventors: Chao-Chin Sung, Tainan (TW); Chueh-Yuan Nien, Tainan (TW); Chien-Tzu Chu, Tainan (TW)

(73) Assignee: CARUX TECHNOLOGY PTE. LTD., Singapore (SG)

( * ) Notice: Subject to any disclaimer, the term of this patent is extended or adjusted under 35 U.S.C. 154(b) by 192 days.

(21) Appl. No.: 18/463,317

(22) Filed: Sep. 8, 2023

(65) Prior Publication Data

US 2024/0133941 A1 Apr. 25, 2024
US 2024/0230749 A9 Jul. 11, 2024

(30) Foreign Application Priority Data

Oct. 20, 2022 (CN) .......................... 202211286159.5

(51) Int. Cl.
*G01R 31/26* (2020.01)
*G01R 1/067* (2006.01)
(52) U.S. Cl.
CPC ....... *G01R 31/2635* (2013.01); *G01R 1/0675* (2013.01)
(58) Field of Classification Search
CPC .............. G01R 1/0675; G01R 31/2635; G01R 31/2818; G01R 31/2831; G01R 1/0483;

G01R 31/2644; G01R 31/2863; G01R 1/06711; G01R 31/2601; G01R 1/0433; G01R 1/07307; G01R 31/2637; G01R 31/2889; G01R 1/07314; G01R 31/2865; G01R 1/04; G06F 30/39; H01L 22/14; H01L 2924/14; H01R 12/714; H01R 13/66; H01R 43/02; H01R 13/2485

See application file for complete search history.

(56) References Cited

U.S. PATENT DOCUMENTS

| | | | | |
|---|---|---|---|---|
| 4,386,459 A | * | 6/1983 | Boulin ............... | G01R 31/2884 |
| | | | | 438/18 |
| 4,835,466 A | * | 5/1989 | Maly .................. | G01R 31/2853 |
| | | | | 324/718 |
| 4,918,377 A | * | 4/1990 | Buehler ................ | G01R 31/30 |
| | | | | 438/18 |
| 5,892,245 A | * | 4/1999 | Hilton .................. | H05K 7/1061 |
| | | | | 257/727 |

(Continued)

FOREIGN PATENT DOCUMENTS

| | | |
|---|---|---|
| TW | 200924229 | 6/2009 |
| TW | I767473 | 6/2022 |

*Primary Examiner* — Vinh P Nguyen
(74) *Attorney, Agent, or Firm* — JCIPRNET

(57) ABSTRACT

An electronic device is provided and includes a substrate, a first contact pad, a second contact pad, an electronic element, and a third contact pad. The first contact pad and the second contact pad are disposed on the substrate. The electronic element is located above the substrate and electrically connected to the first contact pad and the second contact pad. The third contact pad is electrically connected to the first contact pad. A test method for an electronic device is also provided.

17 Claims, 11 Drawing Sheets

(56)  References Cited

U.S. PATENT DOCUMENTS

| | | | |
|---|---|---|---|
| 6,069,482 A * | 5/2000 | Hilton | H01L 23/32 |
| | | | 324/755.08 |
| 6,574,114 B1 * | 6/2003 | Brindle | G02B 6/12007 |
| | | | 174/262 |
| 6,873,146 B2 * | 3/2005 | Liu | G01R 31/2884 |
| | | | 324/756.05 |
| 11,293,941 B2 * | 4/2022 | Crippa | G01R 1/06755 |

* cited by examiner

ELECTRONIC DEVICE HAVING CONTACT PADS FOR TESTING AND MOUNTING ELECTRONIC COMPONENT AND TEST METHOD FOR ELECTRONIC DEVICE

CROSS-REFERENCE TO RELATED APPLICATION

This application claims the priority benefit of China application serial no. 202211286159.5, filed on Oct. 20, 2022. The entirety of the above-mentioned patent application is hereby incorporated by reference herein and made a part of this specification.

BACKGROUND

Technical Field

The disclosure relates to an electronic device and a test method for an electronic device.

Description of Related Art

In order to ensure the quality of an electronic device, whether the electronic elements in the electronic device may be operated normally need to be tested. Corresponding test methods, structures, and tools are often subject to continuous improvement in response to improvements in electronic devices.

SUMMARY

The disclosure is directed to an electronic device including a substrate, a first contact pad, a second contact pad, an electronic element, and a third contact pad. The first contact pad and the second contact pad are disposed on the substrate. The electronic element is located above the substrate and electrically connected to the first contact pad and the second contact pad. The third contact pad is electrically connected to the third contact pad. An area of the third contact pad is greater than an area of the first contact pad.

The disclosure is directed to a test method for an electronic device including the following steps: providing a substrate; disposing a plurality of first contact pads and a plurality of second contact pads on the substrate; providing a test substrate, wherein a plurality of electronic elements are disposed on the test substrate, the test substrate includes a plurality of first conductive pads and a plurality of second conductive pads, each of the electronic elements is connected to one of the plurality of first conductive pads and one of the plurality of second conductive pads, and the plurality of second conductive pads are electrically connected to each other; and providing a plurality of probes to electrically connect the plurality of first conductive pads to the plurality of first contact pads for testing.

DESCRIPTION OF THE EMBODIMENTS

Figure 1:
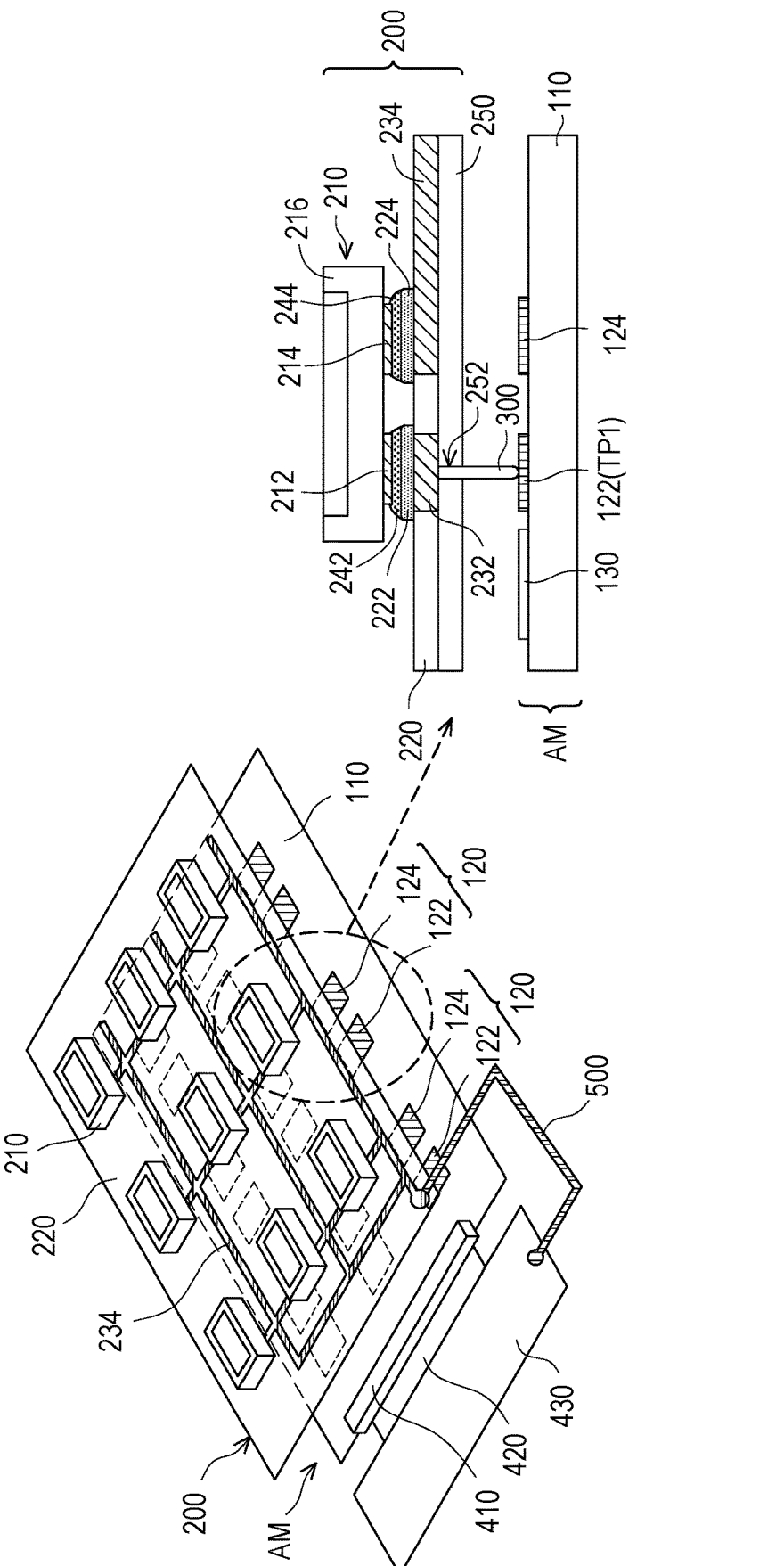
FIG. 1 is used to schematically illustrate a test method for an electronic device of an embodiment of the disclosure.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

The disclosure may be understood by referring to the following detailed description in conjunction with the accompanying drawings. It should be noted that in order to facilitate understanding to the reader and to simplify the drawings, the multiple drawings in the disclosure depict a part of the electronic device, and certain elements in the drawings are not drawn to actual scale. In addition, the quantity and dimension of each element in the figures are for illustration, and are not intended to limit the scope of the disclosure.

Certain terms are used throughout the specification and the appended claims of the disclosure to refer to particular elements. Those skilled in the art should understand that electronic equipment manufacturers may refer to the same elements under different names. This article is not intended to distinguish between elements having the same function but different names. In the following description and claims, the words "including", "containing", "having" and the like are open words, so they should be interpreted as meaning "including but not limited to . . . " Therefore, when the terms "including", "containing", and/or "having" are used in the description of the disclosure, they specify the presence of corresponding features, areas, steps, operations, and/or members, but do not exclude the presence of one or more corresponding features, areas, steps, operations, and/or members.

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative dimension, thickness, and location of each film, area, and/or structure may be reduced or enlarged.

When a corresponding member (e.g., a film layer or region) is referred to as being "disposed or formed on another member", the member may be directly disposed or formed on the other member, or other members may be present in between. Moreover, when a member is referred to as being "directly disposed on or formed on another member", there are no members in between. In addition, when a member is referred to as "disposed or formed on another member", the two members have an up-down relationship in the top view, and this member may be above or below the other member, and this up-down relationship depends on the orientation of the device.

It should be understood that when a member or film layer is referred to as being "connected to" another member or film layer, it may be directly connected to this other member or film layer, or there may be an intervening member or film layer between the two. When a member is said to be "directly connected to" another member or film layer, there is no intervening member or film layer between the two. Moreover, when a member is referred to as being "coupled to another member (or a variant thereof)" or "electrically connected to another member (or a variation thereof)", the member may be directly connected to the other member, or indirectly connected to the other member via one or a plurality of members.

The terms "about", "equal to", "same as" or "identical", "substantially" or "roughly" are generally interpreted as being within 20% of a given value or range, or interpreted as being within 10%, 5%, 3%, 2%, 1%, or 0.5% of a given value or range.

In the disclosure, length, width, thickness, height or area, or distance or pitch between elements may be measured using optical microscopy (OM), scanning electron microscope (SEM), film thickness profiler ($\alpha$-step), ellipse thickness gauge, or other suitable methods. In detail, according to some embodiments, a cross-sectional structure image including the element to be measured may be obtained, and the length, width, thickness, height, or area of each element, or the distance or pitch between elements may be measured using SEM, but the disclosure is not limited thereto.

The ordinal numbers used in the specification and claims, such as "first", "second", etc., are used to modify an element. They do not themselves imply and represent that the element(s) have any previous ordinal quantity, and also do not represent the order of one element and another element, or the order of manufacturing methods. The use of these ordinal numbers is to clearly distinguish an element with a certain name from another element with the same name. The same terms may not be used in the claims and the specification, and accordingly, the first member in the specification may be the second member in the claims.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict with each other, they may be mixed and used arbitrarily. Direction X, direction Y, and direction Z are indicated in the figures disclosed herein below to indicate the orientation of individual elements and devices. In some embodiments, direction X, direction Y, and direction Z are perpendicular to each other, but the disclosure is not limited thereto. In some other embodiments, direction X, direction Y, and direction Z may be three axial directions that intersect two by two, but do not need to be perpendicular. Moreover, the terms first, second, third, etc., described herein below are for convenience to distinguish between a plurality of identical or similar members, features, and/or structures, instead of limiting the order of manufacture, stacking, etc., of these members, features, and/or structures.

An electronic device of disclosure may include a display device, an antenna device, a sensing device, a light-emitting device, or a tiling device, but the disclosure is not limited thereto. The electronic device may include a bendable or flexible electronic device. The electronic device may include an electronic element. The electronic device, for example, includes a liquid-crystal layer or a light-emitting diode (LED). The electronic element may include passive and active elements, such as capacitors, resistors, inductors, variable capacitors, filters, diodes, transistors, sensors, microelectromechanical systems (MEMS), chips, etc., but the disclosure is not limited thereto. The diode may include an LED or a photodiode. The LED may include, for example, an organic light-emitting diode (OLED), a mini LED, a micro LED, or a quantum dot LED, fluorescence, phosphor, or other suitable materials, or a combination of the above, but the disclosure is not limited thereto. The sensor may include, for example, a capacitive sensor, an optical sensor, an electromagnetic sensor, a fingerprint sensor (FPS), a touch sensor, an antenna, or a pen sensor, but the disclosure is not limited thereto. The following uses a display device as an electronic device to explain the content of the disclosure, but the disclosure is not limited thereto.

FIG. 1 is used to schematically illustrate a test method for an electronic device of an embodiment of the disclosure. FIG. 1 substantially shows a test method for testing a semi-finished product of an electronic device, wherein the semi-finished product of the electronic device is, for example, a matrix substrate AM having a circuit structure therein, wherein the matrix substrate AM may be an active matrix substrate. The test method shown in FIG. 1 is generally used to test whether the circuit structure on the matrix substrate AM may be operated normally. After passing the test, the desired electronic element may be disposed on the matrix substrate AM to complete the electronic device. When the test fails, the matrix substrate may be repaired or eliminated, so as to avoid bad matrix substrates resulting in poor yield of the electronic device. Loss in costs caused by the elimination of good electronic elements disposed on a bad matrix substrate may also be avoided.

In FIG. 1, the left side portion schematically represents the strabismus structure and the right side portion schematically represents the side view structure of a partial region. The test method for the electronic device includes providing a substrate 110 and disposing a plurality of first contact pads 122 and a plurality of second contact pads 124 on the substrate 110. A circuit structure may be pre-formed on the substrate 110, for example, a plurality of pixel circuits 130 arranged in a matrix (the right side portion of FIG. 1 schematically represents one pixel circuit 130). The plurality of first contact pads 122 and the plurality of second contact pads 124 may be disposed on the substrate 110 on which the pixel circuits 130 are formed. Therefore, the matrix substrate AM may include the substrate 110, the plurality of pixel circuits 130, the plurality of first contact pads 122, and the plurality of second contact pads 124. The plurality of first contact pads 122 and the plurality of second contact pads 124 are disposed in pairs, for example. For example, each of the first contact pads 122 and one of the second contact pads 124 may form a pad pair 120, and each of the pad pairs 120 may be connected to one of the pixel circuits 130 correspondingly. For ease of description, in the left side portion of FIG. 1, the pad pairs 120 on the substrate 110 are shown and the pixel circuits 130 are omitted, and in the right side portion of FIG. 1, the pixel circuit 130 is shown in a flat rectangular pattern. The pixel circuit 130 may include at least one active element, and may further include at least one capacitive structure. In some embodiments, the pixel circuit 130 includes a circuit structure such as 1T1C, 2T1C, 3T1C, or 6T1C, wherein T is an active element and C is a capacitor, but the disclosure is not limited thereto. The matrix substrate AM may include corresponding signal lines (not shown), and in each of the pad pairs 120, the first contact pad 122 may be connected to one of the pixel circuits 130 and the second contact pad 124 may be connected to a signal line not shown.

After the plurality of first contact pads 122 and the plurality of second contact pads 124 are disposed on the substrate 110, a test substrate 200 may be provided for testing. The test substrate 200 may specifically include a substrate 220, and a plurality of electronic elements 210 may be disposed on the substrate 220. In other words, the plurality of electronic elements 210 are disposed on the test substrate 200. Each of the plurality of electronic elements 210 includes a first conductive pad 212 and a second conductive pad 214. In some embodiments, the substrate 220 may be provided with a first contact portion 222, a second contact portion 224, a conductive circuit portion 232, and a conductive circuit portion 234. The first conductive pad 212 may be bonded and electrically connected to the first contact portion 222, and the conductive circuit portion 232 is electrically connected to the corresponding first contact portion 222. The second conductive pad 214 may be bonded and electrically connected to the second contact portion 224, and the conductive circuit portion 234 is electrically connected to the corresponding second contact portion 224. In some embodiments, as shown in the left side portion of FIG. 1, the conductive circuit portion 234 is connected in a continuous line layout to connect the second contact portion 224 together, so that a plurality of second conductive pads 214 may be electrically connected to each other. However, conductive circuit portions 232 connected to different first contact portions 222 may be independent from each other, so the first conductive pads 212 are electrically independent from each other. In some embodiments, the structure in which the conductive circuit portion 232 and the conductive circuit portion 234 are disposed in the substrate 220 may be regarded as a circuit substrate or a circuit board, but the disclosure is not limited thereto.

The electronic elements 210 may be arranged on the substrate 220 in a matrix. Each of the electronic elements 210 is, for example, an LED element specifically including the first conductive pad 212, the second conductive pad 214, and an element body 216, and the paired first conductive pad 212 and second conductive pad 214 may be disposed at one side of the element body 216, and may be used to electrically connect the electronic element 210 to an external device. The paired first conductive pad 212 and second conductive pad 214 may be connected to the paired first contact portion 222 and second contact portion 224 correspondingly. For example, as shown in the right side portion of FIG. 1, the first conductive pad 212 may be connected to one of the first contact portions 222 via a corresponding bonding conductor 242 and the second conductive pad 214 may be connected to one of the second contact portions 224 via a corresponding bonding conductor 244. The bonding conductor 242 and the bonding conductor 244 are, for example, solder, but the disclosure is not limited thereto. In some embodiments, the element body 216 may be a packaged or unpackaged LED element, one of the first conductive pad 212 and the second conductive pad 214 is a cathode, and the other of the first conductive pad 212 and the second conductive pad 214 is an anode. Therefore, when the second conductive pad 214 is the anode, the arrangement of the second conductive pads 214 being electrically connected to each other via the conductive circuit portion 234 may be used to connect the anodes of the plurality of electronic elements 210 together to provide the test substrate 200 with a common anode. Similarly, when the second conductive pad 214 is the cathode, the arrangement of the second conductive pads 214 being electrically connected to each other via the conductive circuit portion 234 may be used to connect the cathodes of the plurality of electronic elements 210 together to provide the test substrate 200 with a common cathode.

In the present embodiment, a plurality of probes 300 are further provided to electrically connect the first conductive pads 212 of the plurality of electronic elements 210 to the plurality of first contact pads 122 for testing. Specifically, the test substrate 200 may further include another substrate 250. The substrate 250 is disposed at one side of the substrate 220 and is opposite to the electronic elements 210. The substrate 250 may have a plurality of through holes 252, and each of the through holes 252 may correspond to and expose the conductive circuit portion 232 connected to the first conductive pad 212. The probes 300 may be inserted into the through holes 252 and protruded beyond the substrate 250 in a direction away from the electronic elements 210. The test method for the electronic device may include placing the test substrate 200 on the matrix substrate AM, so that the probes 300 are in contact with the matrix substrate AM, and specifically in contact with test pads TP1 on the matrix substrate AM. In the present embodiment, the first contact pads 122 are in contact with the probes 300 as the test pads TP1 for description, but the disclosure is not limited thereto. The probes 300 and the conductive circuit portions 232 may establish an electrical transmission path between the test pads TP1 (the first contact pads 122) and the first conductive pads 212, so that the electronic elements 210 may be electrically connected to the first contact pads 122 and driven by the pixel circuits 130 connected to the first contact pads 122.

In some embodiments, a test probe seat 410 (which may be a probe) may be disposed on the substrate 110 of the matrix substrate AM, and the test probe seat 410 may be electrically connected to a driving circuit board 430 via a connecting member 420. The connecting member 420 may transmit power or/and signals on the driving circuit board 430 to the test probe seat 410. The connecting member 420 may be bent so that the driving circuit board 430 is located at the back side of the substrate 110 (e.g., the side away from the first contact pads 122 and the second contact pads 124). The test probe seat 410 may be disposed on the substrate 110 and located at the front side (i.e., the side where the first contact pads 122 and the second contact pads 124 are located).

The test probe seat 410 may be connected to the corresponding pixel circuit 130 and the corresponding first contact pad 122 and second contact pad 124 via a conductive circuit disposed in the substrate 110 for testing. At the same time, in some embodiments, in the left side portion of FIG. 1, the conductive circuit portion 234 in the test substrate 200 may be electrically connected to the driving circuit board 430 via a transmission member 500, and provide a high potential (ARVDD) or low potential (ARVSS) power signal. In some embodiments, the low potential (ARVSS) power signal may provide a ground potential. In this way, the driving circuit board 430 may provide individual driving signals to the conductive circuit portions 234 in the test substrate 200 and the first contact pads 122 and the second contact pads 124 in the matrix substrate AM. In some embodiments, the driving signal provided to the conductive circuit portions 234 in the test substrate 200 and the driving signal provided to the second contact pads 124 may be the same. For example, the testing method for the electronic device includes, in the state that the probes are in contact with the test pads TP1 (the first contact pads 122), sending a first driving signal to the pixel circuits 130 in the matrix substrate AM via the driving circuit board 430, and sending a second driving signal to the conductive circuit portions 234 in the test substrate 200. The second driving signal may be simultaneously provided to the second contact pads 124 on the matrix substrate AM. When the pixel circuits 130 are not damaged or failed, the first contact pads 124 may receive the corresponding first driving signal, and the first driving signal on the first contact pads 124 may be transmitted to the first contact portions 222 via the probes 300 and further provided to the first conductive pads 212 of the electronic elements 210. At this time, the second conductive pads 214 connected to the second contact portions 224 may receive the second driving signal from the driving circuit board 430 via the transmission member 500 and the conductive circuit portions 234. Therefore, the first conductive pads 212 and the second conductive pads 214 of the electronic elements 210 may receive the first driving signal and the second driving signal respectively, so that the electronic elements 210 may perform an indication function, such as emitting light. If one of the pixel circuits 130 is damaged or fails, the corresponding electronic element 210 may not normally perform the indicating function, for example, may not emit light. Therefore, whether the matrix substrate AM is a good product may be determined by observing whether the electronic elements 210 on the test substrate 200 emit light. The way to observe whether the electronic elements 210 on the test substrate 200 emit light may be observed with the naked eye or with an optical instrument.

In the present embodiment, since the second conductive pads 214 are electrically connected to each other, corresponding probes 300 do not need to be provided one by one to be electrically connected to the corresponding second contact pads 124. Therefore, there are no probes between the second conductive pads 214 of the plurality of electronic elements 210 and the plurality of second contact pads 124. This may significantly reduce the quantity of the probes needed to test the electronic device. For example, the first contact pads 122 and the second contact pads 124 are disposed in pairs, so the quantity of the first contact pads 122 and the second contact pads 124 is the same, for example, each is N. Under the test method shown in FIG. 1, the overall quantity of the first contact pads 122 and the second contact pads 124 is 2N, but N probes 300 are needed to test all of the pixel circuits 130. When the quantity of the probes 300 is reduced, the arrangement density of the probes 300 is reduced accordingly, so the alignment when the probes 300 are mounted is easier, and the alignment error of the probes 300 may be reduced. Furthermore, the probes 300 are inevitably be damaged after performing multiple tests. As the quantity of probes 300 is reduced, the frequency of replacing damaged probes 300 may also be reduced, and replacement may be easier. In addition, the arrangement density of the probes 300 is reduced, so the radial dimension of the probes 300 may not need to be strictly limited. In other words, in the case where the arrangement density of the pixel circuits 130 is high, the probes 300 do not need to adopt a very fine dimension, thus helping to maintain the life of the probes 300 (since the thinner the probes 300, the easier the probes 300 are damaged).

For example, an electronic device (not shown) may be completed by further disposing electronic elements (not shown) on the matrix substrate AM that passed the test. In some embodiments, the electronic elements (not shown) to be disposed on the matrix substrate AM may be, for example, LED elements, sub-millimeter LED elements, micro LED elements, etc., but the disclosure is not limited thereto. In some embodiments, the electronic elements (not shown) to be disposed on the matrix substrate AM may be prefabricated elements, for example, and may be bonded to the first contact pads 122 and the second contact pads 124. In some embodiments, the first contact pads 122 are directly used as the test pads TP1, so electronic elements (not shown) to be disposed on the matrix substrate AM may be bonded to the test pads TP1. In other embodiments, contact pads other than the first contact pads 122 and the second contact pads 124 may be provided on the matrix substrate AM for testing. As such, the test pads TP1 may not need to be in contact with the electronic elements (not shown) in the final electronic device.

Since the electronic elements (not shown) are mounted on the matrix substrate AM after the matrix substrate AM passed the test, the manufacturing yield of the electronic device (not shown) may be improved. Moreover, in order to meet the requirement of high resolution, the dimension of the electronic elements (not shown) is getting smaller, and the layout density of the pixel circuits 130 in the matrix substrate AM needs to be increased accordingly. This makes testing of the electronic device difficult. For example, for testing of the electronic device, the probes 300 need to be disposed corresponding to each of the pixel circuits 130, and conventionally, each of the pixel circuits 130 needs to be tested with two probes, thus increasing the placement density of the probes 300. The higher the arrangement density of the probes 300, the thinner the selected probes 300 may need to be to avoid undesired short circuit, which causes the probes 300 to be more readily damaged. Alternatively, the higher the arrangement density of the probes 300 is, the more difficult it is to align the probes 300 when they are mounted on the substrate 250, resulting in errors in the layout positions of the probes 300. However, in the test substrate 200 of FIG. 1, the plurality of second conductive pads 214 of the test substrate 200 are electrically connected to each other without disposing the probes 300 between the second contact pads 124 and the corresponding second conductive pads 214. Therefore, the quantity and layout density of the probes 300 may be significantly reduced, thus overcoming the issues above caused by the high placement density of the probes. Therefore, the test method for the electronic device shown in FIG. 1 helps to reduce the manufacturing and test costs of the electronic device, and also improves the efficiency of the test process. In addition, the dimension of the probes 300 is more flexible, the mounting of the probes 300 is easier, and the loss of the probes 300 may be reduced.

Figure 2:
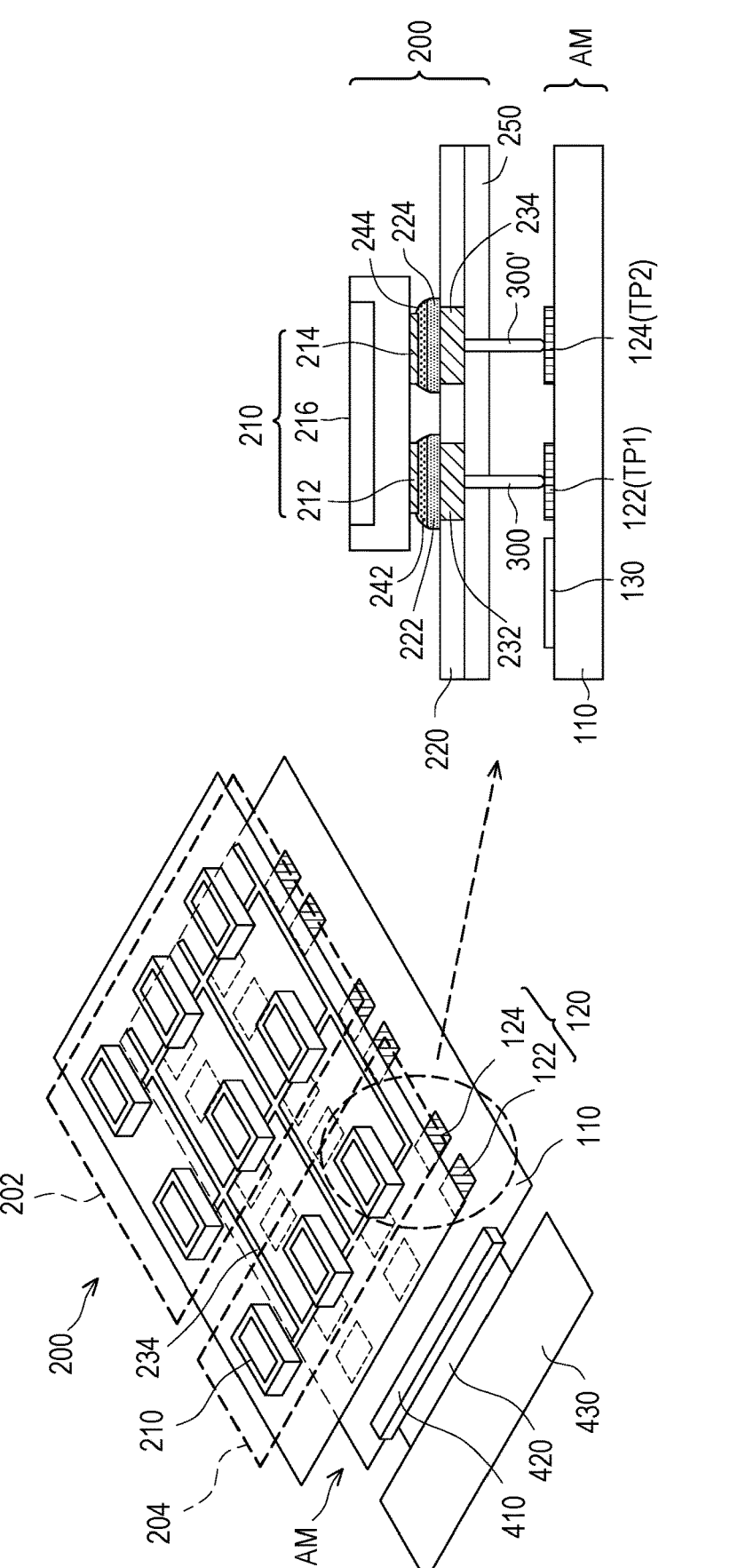
FIG. 2 is used to schematically illustrate a test method for an electronic device of an embodiment of the disclosure.

FIG. 2 is used to schematically illustrate a test method for an electronic device of an embodiment of the disclosure. The test method shown in FIG. 2 is substantially similar to the test method of FIG. 1, and the same reference numerals recited in the two embodiments represent the same members. Accordingly, the descriptions of FIG. 1 for individual members may be applied to the embodiment of FIG. 2. In FIG. 2, the test substrate 200 may be divided into a first region 202 and a second region 204, wherein the side view structure of the first region 202 and the corresponding probes 300 are substantially the same as those described in FIG. 1, and the right side portion of FIG. 2 shows the side view structure of a portion of the second region 204. In the present embodiment, in addition to the probes 300 corresponding to the first conductive pads 212 of all of the electronic elements 210, probes 300' corresponding to the second conductive pads 214 of the electronic elements 210 in the second region 204 are also provided. The test method for the electronic device includes providing the substrate 110; disposing the plurality of first contact pads 122 and the plurality of second contact pads 124 on the substrate 110; providing the test substrate 200; and providing the plurality of probes 300 to electrically connect the plurality of first conductive pads 212 and the plurality of first contact pads 122 for testing. In addition, the test method of the present embodiment further includes providing the plurality of probes 300' to electrically connect the second conductive pads 214 in the second region 204 with the corresponding second contact pads 124. Therefore, the first contact pads 122 and the second contact pads 124 corresponding to the second region 204 are both used as test pads in the present embodiment, namely the test pads TP1 and test pads TP2. The probes 300' are provided to the plurality of second conductive pads 214 in the second region 204, and the plurality of second conductive pads 214 in the first region 202 are not provided with probes. Therefore, the quantity of the probes 300' is less than the quantity of the second conductive pads 214 (or the second contact pads 124).

Referring to FIG. 2, the matrix substrate AM may include the substrate 110, the plurality of first contact pads 122, the plurality of second contact pads 124, the plurality of pixel circuits 130 (one is shown in the right portion of FIG. 2), and a signal line (not shown). The plurality of first contact pads 122 and the plurality of second contact pads 124 are disposed in pairs to form a plurality of contact pad pairs 120. The pixel circuits 130 may be arranged on the substrate 110 in a matrix, and each of the pixel circuits 130 may be connected to the first contact pad 122 of one of the pad pairs 120. The second contact pad 124 of each of the pad pairs 120 may be connected to a signal line not shown. In other words, in each of the pad pairs 120, the first contact pad 122 is connected to the pixel circuit 130 and the second contact pad 124 is not directly connected to the pixel circuit 130. The test probe seat 410 is bonded and electrically connected to the matrix substrate AM and connected to the driving circuit board 430 via the connecting member 420. In addition, the driving circuit board 430 may be connected to an external circuit and/or a power source to enable the test probe seat 410 to perform a driving operation. For example, the driving circuit board 430 may transmit the externally provided power to the test probe seat 410 via the connecting member 420, and the test probe seat 410 provides corresponding driving signals to the pixel circuits 130 and the signal lines (e.g., power lines) not shown, respectively. The pixel circuits 130 may provide a first driving signal to the first contact pads 122 under the control of the driving circuit board 430. At the same time, the driving circuit board 430 may provide a second driving signal to the signal lines (e.g., the power lines) so as to be input to the second contact pads 124.

As shown in FIG. 2, the test substrate 200 may be placed above the matrix substrate AM. The plurality of electronic elements 210 are disposed on the test substrate 200. Each of the electronic elements 210 includes the first conductive pad 212 and the second conductive pad 214. Like the embodiment of FIG. 1, the substrate 220 may be provided with the conductive circuit portions 232 and the conductive circuit portions 234, wherein the conductive circuit portions 232 are electrically connected to the corresponding first conductive pads 212 and the conductive circuit portions 234 are electrically connected to the corresponding second conductive pads 214. In addition, the plurality of second conductive pads 214 may be electrically connected to each other via the conductive circuit portions 234. That is, the conductive circuit portions 234 form a continuous circuit layout. The test method of the present embodiment further includes providing the probes 300 and the probes 300', wherein the probes 300' are disposed in the second region 204, and the probes 300 are disposed in the first region 202 and the second region 204. The probes 300 may be in contact with the test pads TP1 (the first contact pads 122) on the matrix substrate AM and the probes 300' may be in contact with the test pads TP2 (the second contact pads 124) on the matrix substrate AM.

In this way, the first driving signal provided by the driving circuit board 430 may be transmitted to the first contact pad 122 via the corresponding pixel circuit 130 first, then transmitted to the first contact portion 222 via the corresponding probe 300 from each of the test pads TP1 (the first contact pads 122) to be input to the first conductive pad 212 of the corresponding electronic element 210. At the same time, the second driving signal provided by the driving circuit board 430 may be first transmitted to the second contact pad 124 via the corresponding signal line (not shown), then transmitted to the corresponding second conductive pad 214 in the second region 204 via the corresponding probe 300' from the test pad TP2 (the second contact pad 124). Since all of the second conductive pads 214 are electrically connected to each other via the conductive circuit portions 234, the second driving signal input to the second contact portions 224 in the second region 204 may be transmitted to the second conductive pads 214 of all of the electronic elements 210 so that all of the electronic elements 210 receive the second driving signal. As such, the transmission member 500 of FIG. 1 may be omitted. When the pixel circuits 130 are normal, the corresponding electronic elements 210 may issue an indication (e.g., emit light) during the test, otherwise, if the pixel circuits 130 are damaged or defective, correspondingly, the elements 210 do not issue an indication (e.g., do not emit light) during the test. Therefore, whether the pixel circuits 130 at the corresponding positions are normal may be determined by observing whether the electronic elements 210 on the test substrate 200 emit light or not.

Similar to the embodiment of FIG. 1, each of the pad pairs 120 in the first region 202 needs to correspond to one probe 300 to perform the test of the electronic device. Therefore, the layout density and quantity of the probes 300 may be reduced, so that test efficiency may be improved. In addition, the dimension requirements of the probes 300 are more flexible.

For example, after passing the above test, the electronic device may be completed by further disposing electronic elements (not shown) on the matrix substrate AM. In some embodiments, the electronic elements (not shown) to be disposed on the matrix substrate AM may be, for example, LED elements, sub-millimeter LED elements, micro LED elements, etc., but the disclosure is not limited thereto. Electronic elements (not shown) disposed on the matrix substrate AM may be bonded to the first contact pads 122 and the second contact pads 124, and are driven by the pixel circuits 130 to perform the function thereof (e.g., emit light).

In the matrix substrate AM of FIG. 1, the first contact pads 122 are used as the test pads TP1 for direct contact with the probes 300, and in the matrix substrate AM of FIG. 2, all of the first contact pads 122 and the corresponding second contact pads 124 in the second region 204 are used as the test pads TP1 and the test pads TP2 for direct contact with the probes 300 and the probes 300'. However, in other embodiments, in addition to the first contact pads 122 and the second contact pads 124, additional contact pads not shown may be included, and the additional contact pads may be used to provide contact with the probes 300 and the probes 300' as the test pads TP1 and/or the test pads TP2. In some embodiments, the first contact pads 122 in FIG. 1 and FIG. 2 may be electrically connected to additional contact pad (e.g., third contact pads (not shown)), and the probes 300 are in contact with the third contact pads (not shown) during testing. Moreover, the second contact pads 124 in the corresponding second region 204 in FIG. 2 may be electrically connected to additional contact pads (e.g., fourth contact pads (not shown)), and the probe 300' may be in contact with the fourth contact pads (not shown) during testing. As such, the first contact pads 122 and/or the second contact pads 124 may be not in contact with the probes. In some embodiments, the area of the third contact pads (not shown) may be greater than the area of the first contact pads 122, and/or the area of the fourth contact pads (not shown) may be greater than the area of the second contact pads 124. In this way, the probes 300 and the probes 300' may be in contact with the third contact pads (not shown) and the fourth contact pads (not shown) having greater a area to facilitate contact alignment, and the dimension of the probes 300 and the probes 300' may be more flexible (for example, a thicker dimension may be used).

Figure 3:
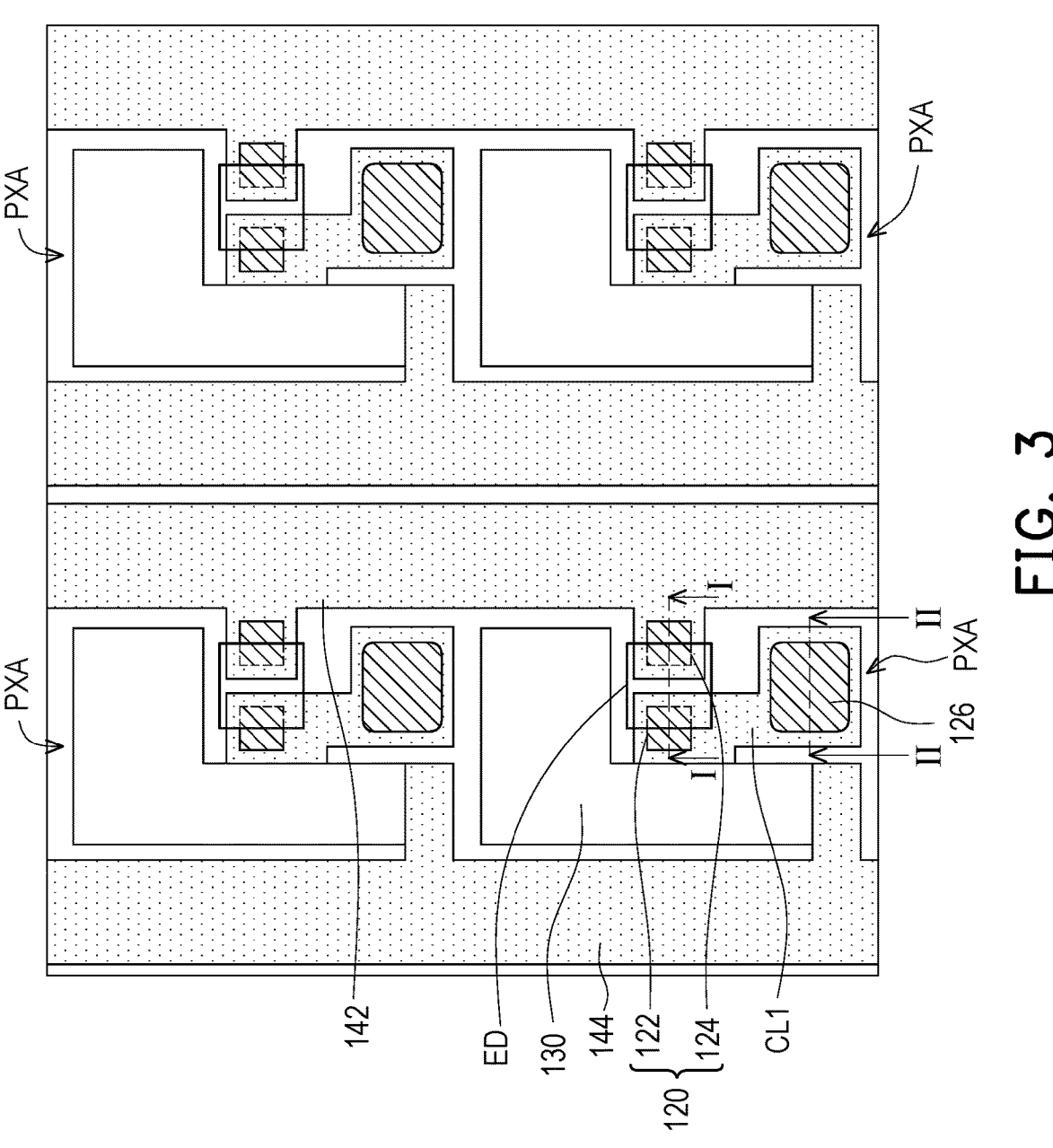
FIG. 3 is a partial schematic top view of an electronic device of an embodiment of the disclosure.

FIG. 3 is a partial schematic top view of an electronic device of an embodiment of the disclosure. An electronic device 100A of FIG. 3 includes the substrate 110, the first contact pads 122, the second contact pads 124, third contact pads 126, and electronic elements ED. The first contact pads 122 and the second contact pads 124 are disposed on the substrate 110. The electronic elements ED are located above the substrate 110 and electrically connected to the first contact pads 122 and the second contact pads 124. The third contact pads 126 are electrically connected to the first contact pads 122. The electronic elements ED may be prefabricated elements, such as LED elements, sub-milli-meter LED elements, micro LED elements, and the like. The electronic elements ED may be bonded and electrically connected to the first contact pads 122 and the second contact pads 124. In the present embodiment, the third contact pads 126 are electrically connected to the first contact pads 122, for example, via conductive lines CL1. The electronic device 100A of FIG. 3 may be applied to the test method described in FIG. 1, and the probes 300 of FIG. 1 may be in contact with the third contact pads 126 during testing. Therefore, the third contact pads 126 may be used as the test pads TP1 of FIG. 1. In other words, neither the first contact pads 122 nor the second contact pads 124 of FIG. 3 are used for testing. In some embodiments, the area of the third contact pads 126 is greater than the area of the first contact pads 122, for example, thus helping to improve test efficiency. For the test method for the electronic device 100A, reference may be made to the related description of FIG. 1, which is not repeated.

Moreover, the substrate 110 is also provided with members such as the pixel circuit 130, a signal line 142, and a signal line 144, and the substrate 110, the first contact pad 122, the second contact pad 124, the pixel circuit 130, the signal line 142, and the signal line 144 may form an embodiment of the matrix substrate AM of FIG. 1. The first contact pad 122 may be connected to the pixel circuit 130, the second contact pad 124 may be connected to the signal line 142, and the pixel circuit 130 may be connected to the signal line 144. The signal line 142 and the signal line 144 may receive power from the outside, wherein when the pixel circuit 130 is controlled to be turned on, the power received by the signal line 144 may be input to the first contact pad 122 as a first driving signal, and the signal line 142 may input the received power to the second contact pad 124 as a second driving signal. The electronic element ED may be driven by the first driving signal and the second driving signal to perform the function thereof (e.g., emit light). The electronic element ED and the pixel circuit 130 form one pixel unit PXA, and the electronic device 100A may include a plurality of pixel units PXA arranged in a matrix. In some embodiments, the signal line 142 and the signal line 144 may be extended continuously between two adjacent columns of pixel units PXA, and each of the signal line 142 and the signal line 144 may be connected to the pixel units PXA in the same column to transmit the desired driving signal.

Figure 4:
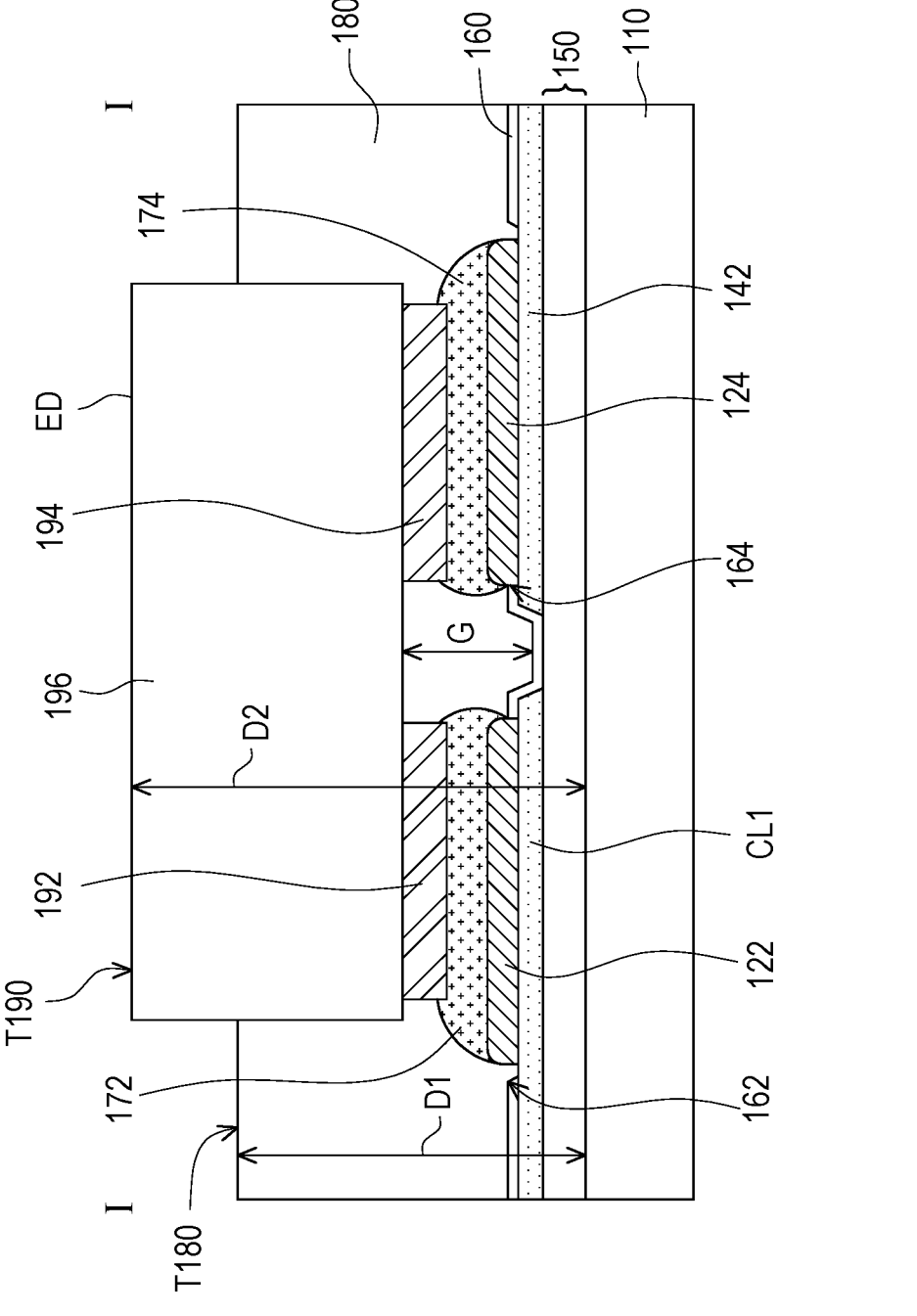
FIG. 4 is a schematic cross-sectional view of an electronic device of an embodiment.
Figure 5:
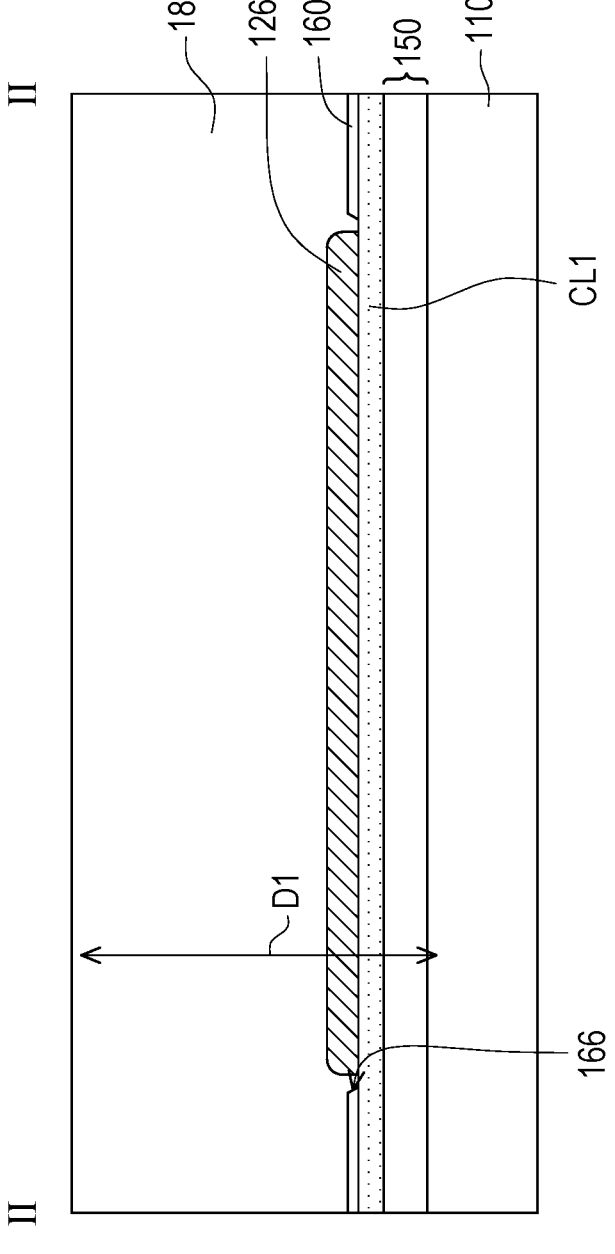
FIG. 5 is a schematic cross-sectional view of an electronic device of an embodiment.

FIG. 4 is a schematic cross-sectional view of an electronic device of an embodiment. The cross-sectional schematic diagram of FIG. 4 corresponds substantially to line I-I of FIG. 3, and therefore the same reference numerals are used to designate the same members in both figures. The structure of FIG. 4 may be used as an embodiment of the cross section of the electronic device 100A of FIG. 3 along line I-I. FIG. 5 is a schematic cross-sectional view of an electronic device of an embodiment. The cross-sectional schematic diagram of FIG. 5 corresponds substantially to line II-II of FIG. 3, and therefore the same reference numerals are used to designate the same members in both figures. The structure of FIG. 5 may be used as an embodiment of the cross section of the electronic device 100A of FIG. 3 along line II-II.

Referring to FIG. 3, FIG. 4, and FIG. 5 simultaneously, the electronic device 100A further includes an insulating layer structure 150, a protective layer 160, a bonding conductor 172, a bonding conductor 174, and a reflective layer 180. The insulating layer structure 150 is disposed on the substrate 110, and may include a plurality of insulating layers (in order to simplify the drawing, the insulating layers are not individually shown). The insulating layer structure 150 may be used to separate different conductive materials and/or semiconductor materials, and may include insulating materials such as silicon oxide, silicon nitride, silicon oxynitride, or other insulating materials. The conductive line CL1 and the signal line 142 (as well as the signal line 144) may be disposed on the insulating layer structure 150.

The protective layer 160 covers the conductive line CL1 and the signal line 142, and the protective layer 160 has an opening 162, an opening 164, and an opening 166 respectively exposing the conductive line CL1 and the signal line 142. The first contact pad 122 is disposed on a portion of the conductive line CL1 exposed by the opening 162, the second contact pad 124 is disposed on a portion of the signal line 142 exposed by the opening 164, and the third contact pad 126 is disposed on another portion of the conductive line CL1 exposed by the opening 166. In other words, the opening 162, the opening 164, and the opening 166 may correspond to the first contact pad 122, the second contact pad 124, and the third contact pad 126, respectively. In some embodiments, the dimension of the first contact pad 122, the second contact pad 124, and the third contact pad 126 may respectively exceed the opening 162, the opening 164, and the opening 166, and the first contact pad 122, the second contact pad 124, and the third contact pad 126 may be partially disposed on the protective layer 160. Alternatively, the dimension of the first contact pad 122, the second contact pad 124, and the third contact pad 126 may be less than the dimension of the opening 162, the opening 164, and the opening 166, respectively. That is, the dimension of the first contact pad 122, the second contact pad 124, and the third contact pad 126 may be different from the dimension of the opening 162, the opening 164, and the opening 166, but the disclosure is not limited thereto.

In some embodiments, the material of the first contact pad 122, the second contact pad 124, and the third contact pad 126 is different from the material of the conductive line CL1 and the signal line 142. For example, the material of the first contact pad 122, the second contact pad 124, and the third contact pad 126 includes nickel, gold, copper, an alloy of the above, or a combination of the above, but the disclosure is not limited thereto. The conductive line CL1 and the signal line 142 may be single-layer or multi-layer structures. The material of the conductive line CL1 and the signal line 142 includes copper, titanium, molybdenum, an alloy of the above, or a combination of the above, but the disclosure is not limited thereto. In some embodiments, the first contact pad 122, the second contact pad 124, and the third contact pad 126 include a bottom layer of a first material and a surface layer of a second material, and the first material may be nickel or nickel/gold and the second material may be copper. In some embodiments, the first contact pad 122 and the third contact pad 126 may be formed by the respective portions of the conductive line CL exposed by the opening 162 and the opening 164, and the second contact pad 124 may be formed by a portion of the signal line 142 exposed by the opening 166.

The electronic element ED is located above the substrate 110, and the electronic element ED may be electrically connected to the first contact pad 122 and the second contact pad 124 by bonding the bonding conductor 172 and the bonding conductor 174 and electrically connecting the two to the first contact pad 122 and the second contact pad 124 on the substrate 110. For example, the electronic element ED may have a first conductive pad 192 and a second conductive pad 194, the first conductive pad 192 is bonded and electrically connected to the first contact pad 122 via the bonding conductor 172, and the second conductive pad 194 is bonded and electrically connected to the second contact pad 124 via the bonding conductor 174. In some embodiments, the electronic element ED may include an element body 196, and the first conductive pad 192 and the second conductive pad 194 are located at a side of the element body 196. The element body 196 may include an LED chip. In some embodiments, the element body 196 may further include an encapsulation structure encapsulating the LED chip, so the electronic element ED may be a packaged element, but the disclosure is not limited thereto.

The reflective layer 180 is disposed on the substrate 110 and covers the protective layer 160. The reflective layer 180 may fill the gap between the element body 196 of the electronic element ED and the protective layer 160. The reflective layer 180 may be formed on the protective layer 160 by coating, so as to fill the region around the electronic element ED. Therefore, the reflective layer 180 may cover the third contact pad 126 not in contact with the electronic element ED. In some embodiments, the reflective layer 180 may be colored reflective paint such as white, black, and gray, but the disclosure is not limited thereto. Since the third contact pad 126 is provided for testing, the reflective layer 180 may also be understood to cover the third contact pad 126 for testing. The reflective layer 180 may be directly in contact with and cover the third contact pad 126. Moreover, the thickness of the reflective layer 180 is set so that a top surface T180 of the reflective layer 180 is not higher than a top surface T190 of the electronic element ED. Therefore, a distance D1 between the top surface T180 of the reflective layer 180 and the substrate 110 is less than a distance D2 between the top surface T190 of the electronic element ED and the substrate 110.

Figure 6:
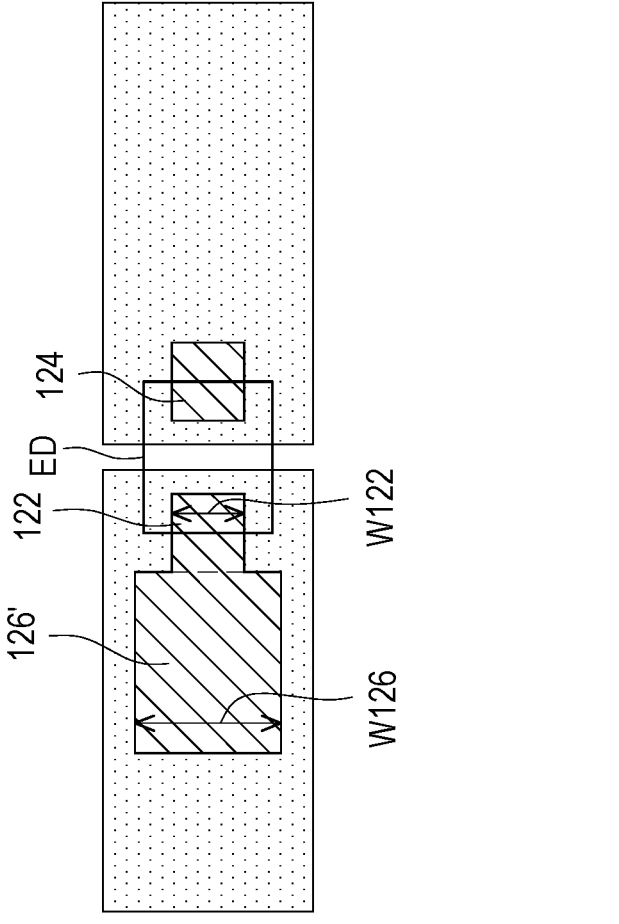
FIG. 6 is a schematic top view of a first contact pad, a second contact pad, and a third contact pad of an embodiment.

FIG. 6 is a schematic top view of a first contact pad, a second contact pad, and a third contact pad of an embodiment. The first contact pad 122 and the second contact pad 124 shown in FIG. 6 are substantially the same as those shown in FIG. 3, but the arrangement position of a third contact pad 126' is different from the arrangement position of the third contact pad 126 of FIG. 3. Specifically, in the embodiment of FIG. 6, the third contact pad 126' is in direct contact with the first contact pad 122. In addition, a width W122 of the first contact pad 122 is less than a width W126' of the third contact pad 126'. The area of the first contact pad 122 is less than the area of the third contact pad 126'. As shown in FIG. 6, the third contact pad 126' and the first contact pad 122 may be connected in a mesa-shape.

Figure 7:
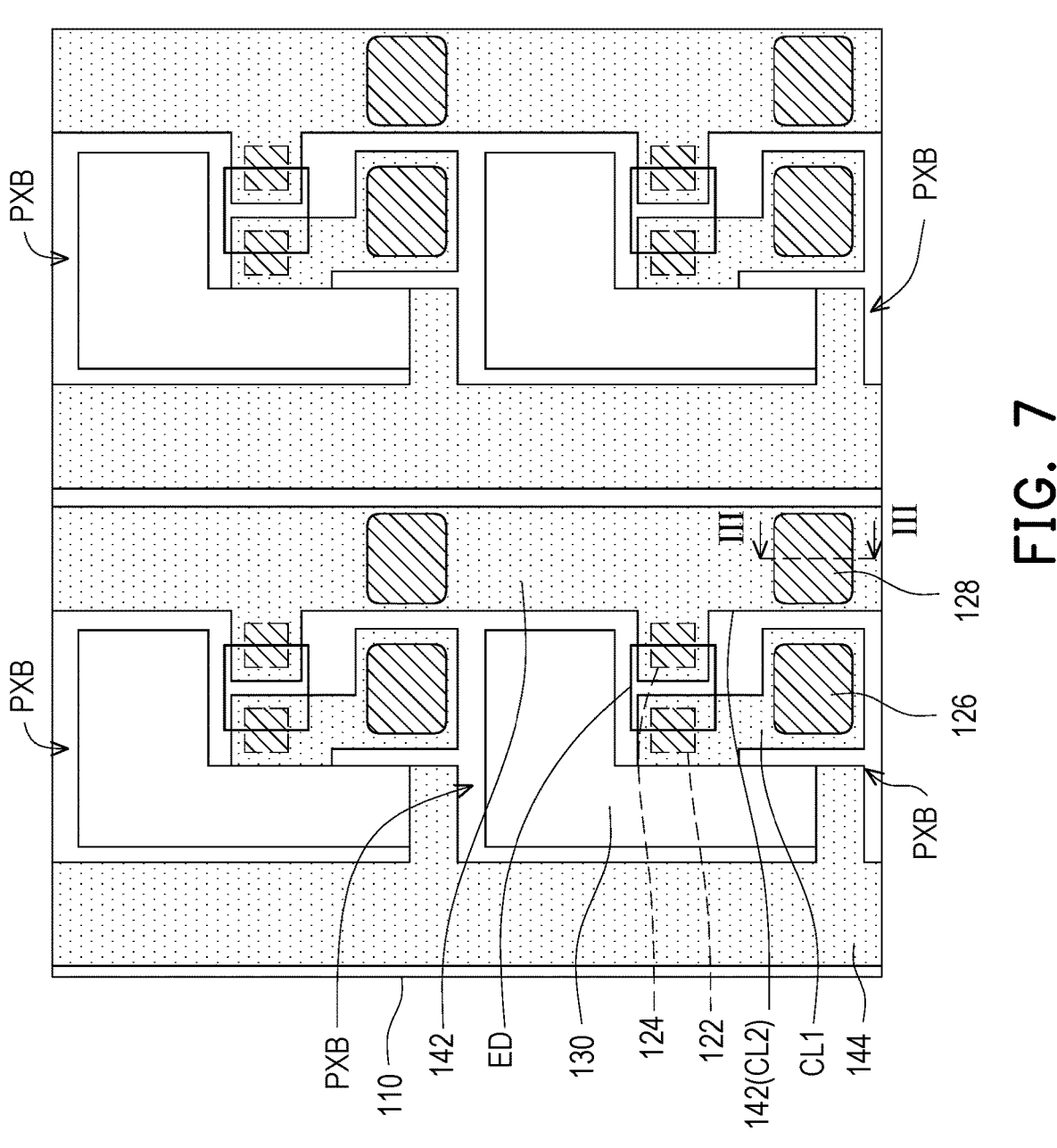
FIG. 7 is a partial schematic top view of an electronic device of an embodiment of the disclosure.

FIG. 7 is a partial schematic top view of an electronic device of an embodiment of the disclosure. An electronic device 100B of FIG. 7 is substantially similar to the electronic device 100A of FIG. 3, so the same members in the two embodiments are denoted by the same reference numerals. The electronic device 100B includes the substrate 110, the first contact pad 122, the second contact pad 124, the third contact pad 126, and the electronic element ED recited in FIG. 3, and a fourth contact pad 128 is further included to form a pixel unit PXB, wherein the structure and description of the substrate 110, the first contact pad 122, the second contact pad 124, the third contact pad 126, and the electronic element ED are as provided in the description of FIG. 3. In the present embodiment, the fourth contact pad 128 may be electrically connected to the second contact pad 124. The fourth contact pad 128 and the second contact pad 124 are spaced apart from each other, and the fourth contact pad 128 may be electrically connected to the second contact pad 124 via a conductive line CL2. For example, the fourth contact pad 128 and the second contact pad 124 may both be connected to the signal line 142 to be electrically connected to each other. Therefore, the signal line 142 may be used as the conductive line CL2 for electrically connecting the fourth contact pad 128 to the second contact pad 124. The fourth contact pad 128 may provide a similar function to the third contact pad 126. That is, the fourth contact pad 128 is in contact with the probe during the test process, and the fourth contact pad 128 is not bonded to the electronic element ED. In some embodiments, the area of the fourth contact pad 128 may be greater than the area of the second contact pad 124 to provide a large-area test pad. In some embodiments, the area of the third contact pad 126 and the fourth contact pad 128 may be greater than the area of the first contact pad 122 and the second contact pad 124 to provide large-area test pads. In some embodiments, the test method for the second region 204 recited in FIG. 2 may be applied to test the electronic device 100B. That is, the fourth contact pad 128 may be directly in contact with the probe 300', so that the probe 300' receives the driving signal of the second contact pad 124. In some embodiments, the pixel unit PXA of the electronic device 100A and the pixel unit PXB of the electronic device 100B may be integrated and tested by using the test method recited in FIG. 2. For example, the test method shown in the first region 202 in FIG. 2 is used to test the pixel unit PXA, and the test method shown in the second region 204 is used to test the pixel unit PXB.

Figure 8:
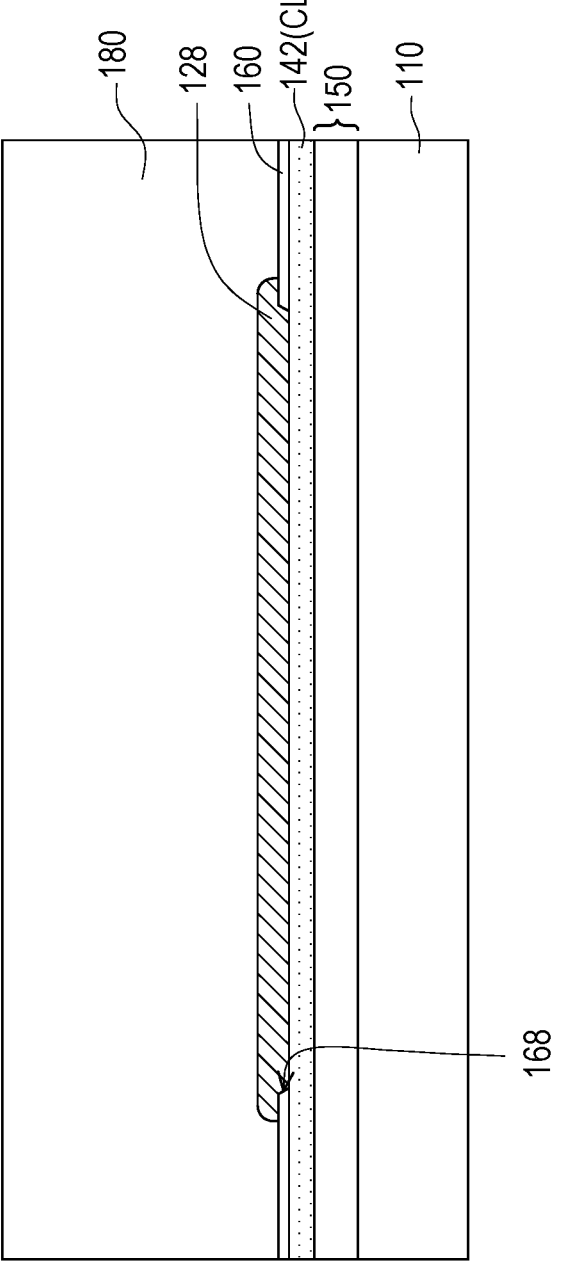
FIG. 8 is a schematic cross-sectional view of an electronic device of an embodiment.

FIG. 8 is a schematic cross-sectional view of an electronic device of an embodiment. The cross-sectional schematic diagram of FIG. 8 corresponds substantially to line III-III of FIG. 7, and therefore the same reference numerals are used to designate the same members in both figures. Referring to FIG. 7 and FIG. 8, the electronic device 100B further includes the insulating layer structure 150, the protective layer 160, and the reflective layer 180. For the description of the insulating layer structure 150, the protective layer 160, and the reflective layer 180, reference may be made to the related descriptions of FIG. 3, FIG. 4, and FIG. 5. In the present embodiment, the protective layer 160 has an opening 168 exposing a portion of the conductive line CL2 (the signal line 142), and the fourth contact pad 128 is disposed corresponding to the opening 168 to be in contact with the conductive line CL2. The material and structure of the fourth contact pad 128 are similar to that of the third contact pad 126, so reference may be made to the description of the foregoing embodiments. In addition, the reflective layer 180 covers and is directly in contact with the fourth contact pad 128.

Figure 9:
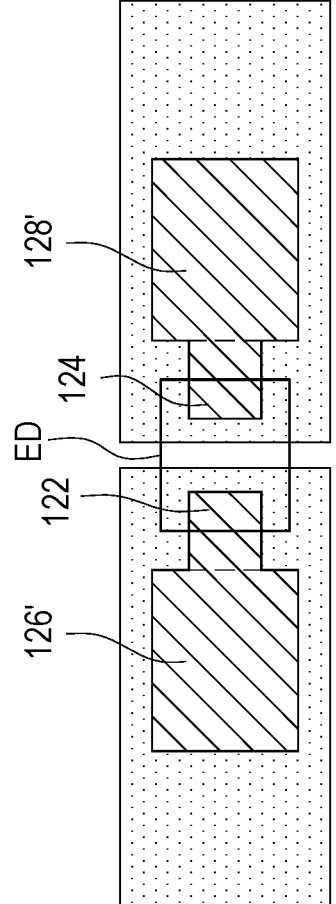
FIG. 9 is a schematic top view of a first contact pad, a second contact pad, and a third contact pad of an embodiment.

FIG. 9 is a schematic top view of a first contact pad, a second contact pad, and a third contact pad of an embodiment. The first contact pad 122 and the second contact pad 124 shown in FIG. 9 are substantially the same as those shown in FIG. 7. However, the arrangement positions of the third contact pad 126' and a fourth contact pad 128' are different from the arrangement positions of the third contact pad 126 and the fourth contact pad 128 of FIG. 7. Specifically, in the embodiment of FIG. 9, the third contact pad 126' is in direct contact with the first contact pad 122 and the fourth contact pad 128' is in direct contact with the second contact pad 124. In addition, as shown in FIG. 8, the third contact pad 126' and the first contact pad 122 may be connected in a mesa-shape and the fourth contact pad 128' and the second contact pad 124 may be connected in a mesa-shape.

Figure 10:
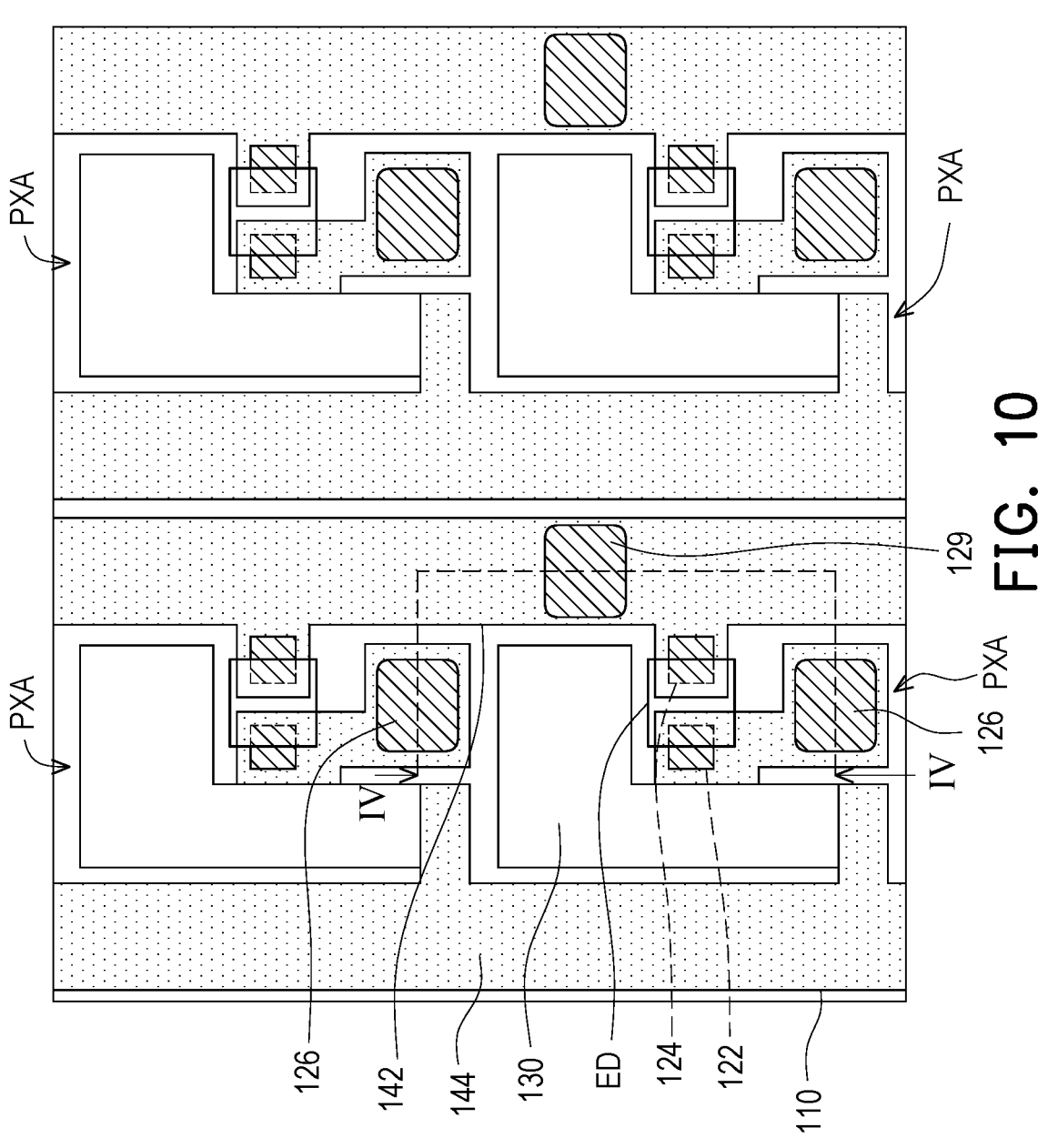
FIG. 10 is a partial schematic top view of an electronic device of an embodiment of the disclosure.

FIG. 10 is a partial schematic top view of an electronic device of an embodiment of the disclosure. An electronic device 100C of FIG. 10 is substantially similar to the electronic device 100A of FIG. 3, so the same members in the embodiments are denoted by the same reference numerals. In FIG. 10, the electronic device 100C may include the substrate 110, the first contact pad 122, the second contact pad 124, the third contact pad 126, and the electronic element ED, and further includes the pixel circuit 130, the signal line 142, and the signal line 144. The above members are as described in FIG. 3 and are not repeated. Specifically, the electronic device 100C further includes a fourth contact pad 129 disposed corresponding to the signal line 142. The cross-sectional structure of the fourth contact pad 129 may be similar to the fourth contact pad 128 described in FIG. 8, but the fourth contact pad 129 may be disposed on any position of the signal line 142 without corresponding to the second contact pad 124. In addition, the quantity of the fourth contact pad 129 may be equal to the quantity of the signal line 142 independent of the quantity of the second contact pad 124. It may be known from FIG. 10 that, the fourth contact pad 129 is electrically connected to the plurality of second contact pads 124 (may correspond to the conductive pad of one of the plurality of electronic elements ED) via the signal line 142. Therefore, by testing the fourth contact pad 129, whether the electrical connection relationship between the plurality of related elements is normal may be known.

Figure 11:
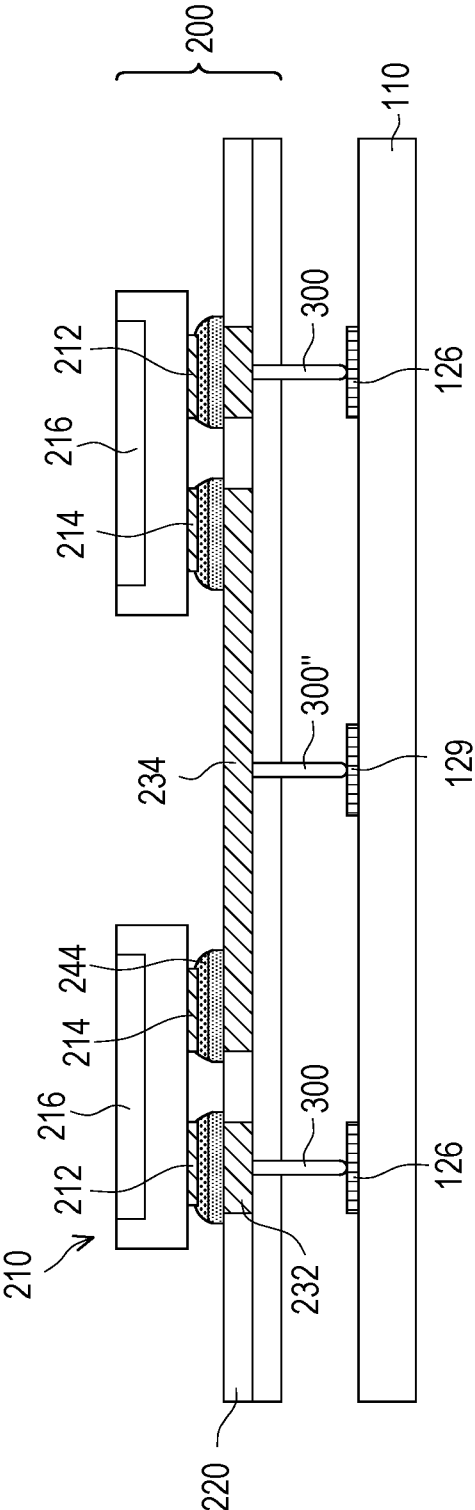
FIG. 11 is used to schematically illustrate a test method for an electronic device of an embodiment of the disclosure.

FIG. 11 is used to schematically illustrate a test method for an electronic device of an embodiment of the disclosure. The test method shown in FIG. 11 is substantially similar to the test method of FIG. 1 and FIG. 2, and the same reference numerals recited in the embodiments represent the same members. The test method shown in FIG. 11 roughly corresponds to the path of line IV-IV in FIG. 10. FIG. 11 may be used to illustrate one embodiment of a test method for the electronic device 100C. The test method for the electronic device 100C includes providing the substrate 110; disposing the first contact pad 122, the second contact pad 124, and the third contact pad 126 on the substrate 110; providing the test substrate 200, wherein the plurality of electronic elements 210 are disposed on the test substrate 200; and providing the plurality of probes 300 to electrically connect the first conductive pads 212 and the first contact pads 122. In addition, the test method of FIG. 11 further includes disposing the fourth contact pad 129 on the substrate 110; and providing the probe 300" to electrically connect the fourth contact pad 129 with the conductive circuit portion 234 for testing.

The plurality of electronic elements 210 are disposed on the test substrate 200. Each of the electronic elements 210 includes the first conductive pad 212 and the second conductive pad 214, and the second conductive pads 214 of the electronic elements 210 are electrically connected to each other. The test substrate 200 may specifically include the substrate 220, and the plurality of electronic elements 210 may be disposed on the substrate 220. The substrate 220 may be provided with the first contact portion 222, the second contact portion 224, the conductive circuit portion 232, and the conductive circuit portion 234. The conductive circuit portion 232 is connected to the first contact portion 222, and the conductive circuit portion 234 is connected to the second contact portion 224. In addition, the conductive circuit portion 234 may connect at least two second conductive pads 214 together. During testing, the probe 300 may be disposed corresponding to the conductive circuit portion 232, and the probe 300" may be disposed corresponding to the conductive circuit portion 234. In addition, a plurality of probes 300 may be in contact with individual third contact pads 126, and the probe 300" is in contact with the fourth contact pad 129. Since the conductive circuit portion 234 is connected to the second contact portion 224 to electrically connect the second conductive pads 214 to each other, the second conductive pads 214 of the plurality of electronic elements 210 may receive corresponding signals via the same probe 300", thus helping to reduce the overall quantity of the probe 300" and the probes 300. Therefore, as described in the above embodiments, the alignment when the probes 300 and the probe 300" are mounted and the replacement of the probes 300 and the probe 300" are easier. In addition, the dimension selection of the probes 300 and the probe 300" is more flexible.

Based on the above, the electronic device of the disclosure includes a plurality of contact pads, and the contact pads on the electronic device may be used for mounting the electronic elements and also for testing. The electronic elements are mounted after testing, so that the electronic device has a high yield. Therefore, the loss rate of electronic elements is lower, thus helping to reduce costs. In the electronic device of the disclosure, the contact pads for testing and the contact pads for mounting the electronic elements may have different areas to facilitate testing. In addition, the test substrate for testing the electronic device may include a plurality of electronic elements, and each of the electronic elements includes a first conductive pad and a second conductive pad. The test substrate may connect the second conductive pads of several or all of the electronic elements together, and receive signals using the same transmission member or probe. In this way, the quantity of probes used is reduced, the mounting, alignment, and replacement of the probes are easier, and the dimension selection of the probes is also more flexible. In addition, the quantity of contact pads for testing in the electronic device may also be less than the quantity of contact pads for mounting the electronic elements.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. An electronic device, comprising:
a substrate;
a first contact pad and a second contact pad disposed on the substrate;
an electronic element located above the substrate, wherein the electronic element is bonded and electrically connected to the first contact pad and the second contact pad;
a third contact pad electrically connected to the first contact pad, wherein an area of the third contact pad is greater than an area of the first contact pad; and
a protective layer, wherein the protective layer comprises a plurality of openings, and the plurality of openings respectively correspond to the first contact pad, the second contact pad, and the third contact pad.

2. The electronic device of claim 1, wherein the third contact pad is electrically connected to the first contact pad via a conductive line.

3. The electronic device of claim 1, wherein the third contact pad is in direct contact with the first contact pad.

4. The electronic device of claim 3, wherein the third contact pad is connected to the first contact pad in a mesa-shape.

5. The electronic device of claim 1, further comprising a fourth contact pad, wherein the fourth contact pad is electrically connected to the second contact pad.

6. The electronic device of claim 5, wherein the fourth contact pad is electrically connected to the second contact pad via a conductive line.

7. The electronic device of claim 5, wherein the fourth contact pad is in direct contact with the second contact pad.

8. The electronic device of claim 7, wherein the fourth contact pad is connected to the second contact pad in a mesa-shape.

9. The electronic device of claim 1, further comprising a pixel circuit and a signal line, wherein the first contact pad is connected to the pixel circuit and the second contact pad is connected to the signal line.

10. The electronic device of claim 1, wherein a width of the first contact pad is less than a width of the third contact pad.

11. The electronic device of claim 1, wherein a dimension of the first contact pad, the second contact pad, and the third contact pad may be different from a dimension of the plurality of corresponding openings.

12. The electronic device of claim 1, further comprising a reflective layer disposed on the substrate, wherein the reflective layer covers the third contact pad.

13. A test method for an electronic device, comprising:
providing a substrate;
disposing a plurality of first contact pads and a plurality of second contact pads on the substrate;
providing a test substrate, wherein a plurality of electronic elements are disposed on the test substrate, each of the plurality of electronic elements comprises a first conductive pad and a second conductive pad, and the second conductive pads of the plurality of electronic elements are electrically connected to each other; and
providing a plurality of probes to electrically connect the first conductive pads of the plurality of electronic elements to the plurality of first contact pads for testing.

14. The testing method for the electronic device of claim 13, wherein there are no probes between the second conductive pads of the plurality of electronic elements and the plurality of second contact pads.

15. The testing method for the electronic device of claim 13, further comprising disposing a third contact pad on the substrate, wherein the third contact pad is electrically connected to the first contact pad; and electrically connecting the third contact pad to the first conductive pads on the test substrate for testing.

16. The testing method for the electronic device of claim 13, further comprising disposing a fourth contact pad on the substrate, wherein the fourth contact pad is electrically connected to the second contact pad; and electrically connecting the fourth contact pad to the second conductive pads on the test substrate for testing.

17. The testing method for the electronic device of claim 13, wherein a quantity of the first contact pads and the second contact pads is N respectively, and a quantity of the probes is N.

* * * * *